United States Patent
Pei et al.

(10) Patent No.: US 10,392,692 B2
(45) Date of Patent: Aug. 27, 2019

(54) CRUCIBLE FOR OLED EVAPORATION SOURCE AND MANUFACTURING METHOD THEREOF

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Fengwei Pei, Beijing (CN); Feng Liu, Beijing (CN); Kelei Liu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 194 days.

(21) Appl. No.: 15/323,330

(22) PCT Filed: Dec. 25, 2015

(86) PCT No.: PCT/CN2015/098910
§ 371 (c)(1),
(2) Date: Dec. 30, 2016

(87) PCT Pub. No.: WO2017/028446
PCT Pub. Date: Feb. 23, 2017

(65) Prior Publication Data
US 2017/0198388 A1 Jul. 13, 2017

(30) Foreign Application Priority Data
Aug. 19, 2015 (CN) .......................... 2015 1 0510904

(51) Int. Cl.
*C23C 16/00* (2006.01)
*C23C 14/24* (2006.01)
(Continued)

(52) U.S. Cl.
CPC .......... *C23C 14/243* (2013.01); *H01L 51/001* (2013.01); *H01L 51/56* (2013.01)

(58) Field of Classification Search
CPC .................................................... C23C 14/243
See application file for complete search history.

(56) References Cited

U.S. PATENT DOCUMENTS 3,901,647 A * 8/1975 Relyea .................. C23C 14/243
220/62.11
5,031,229 A * 7/1991 Chow .................... C23C 14/243
392/389
(Continued)

FOREIGN PATENT DOCUMENTS

CN          1424427 A    6/2003
CN        102351407 A    2/2012
(Continued)

OTHER PUBLICATIONS

First Chinese Office Action (including English translation) dated Aug. 5, 2016, for corresponding Chinese Application No. 201510510904.3.
(Continued)

*Primary Examiner* — Keath T Chen
(74) *Attorney, Agent, or Firm* — Kinney & Lange, P.A.

(57) ABSTRACT

Embodiments of the present disclosure provide a crucible for OLED evaporation source and a manufacturing method thereof. The crucible comprises a body and an inner plate provided on the body. A bottom of the body is gradually enlarged from down to up in a cross section perpendicular to a length direction of the body. The bottom of the body is designed to have a V shape, a U shape or a combined shape thereof in the cross section perpendicular to the length direction of the body.

12 Claims, 6 Drawing Sheets

(51) Int. Cl.
*H01L 51/56* (2006.01)
*H01L 51/00* (2006.01)

(56) References Cited

U.S. PATENT DOCUMENTS

| | | | | |
|---|---|---|---|---|
| 5,532,102 | A | * | 7/1996 | Soden .................. C23C 14/243 118/719 |
| 5,714,008 | A | * | 2/1998 | Lee ..................... C30B 23/066 117/108 |
| 6,509,061 | B1 | * | 1/2003 | Ida ........................ C23C 14/24 118/726 |
| 2004/0200416 | A1 | * | 10/2004 | Schuler ................ C23C 14/243 118/723 E |
| 2005/0005857 | A1 | * | 1/2005 | Kido .................... C23C 14/044 118/726 |
| 2009/0098280 | A1 | | 4/2009 | Tahon |
| 2012/0057222 | A1 | | 3/2012 | Hashimoto et al. |
| 2014/0245955 | A1 | * | 9/2014 | Guyaux ................ C23C 14/225 118/715 |

FOREIGN PATENT DOCUMENTS

| | | |
|---|---|---|
| CN | 102597334 A | 7/2012 |
| CN | 102758180 A | 10/2012 |
| CN | 105088145 A | 11/2015 |
| JP | 2007169729 A | 7/2007 |
| JP | 2013209687 A | 10/2013 |

OTHER PUBLICATIONS

International Search Report and Written Opinion (including English translation of Box V) dated May 9, 2016 for corresponding PCT Application No. PCT/CN2015/098910.
Extended European Search Report dated Mar. 6, 2019, received for corresponding Chinese Application No. 15891412.7, 46 pages.

* cited by examiner

CRUCIBLE FOR OLED EVAPORATION SOURCE AND MANUFACTURING METHOD THEREOF

BACKGROUND OF THE DISCLOSURE

Field of the Disclosure

The present disclosure relates to a field of display technology, in particular to a crucible for OLED evaporation source and a manufacturing method thereof.

Description of the Related Art

With people to pursuit of higher quality display product, OLED has become a most potential emerging technology instead of LCD (liquid crystal display). OLED technology is in a rapid development stage. OLED display products are typically produced by means of evaporating organic materials at home and abroad. Performances of RGB pixels such as color cast, efficiency and so on are dependent on characteristics of evaporated film layers such as uniformity or the like. During the evaporation, the uniformity of the evaporated film layers is directly dependent on a crucible for evaporation source used as a key component in the evaporation.

However, an existing crucible for OLED evaporation source generally has a flat-bottom structure. In addition, the organic material has a high viscosity and a surface tension effect is presented after the organic material is liquefied. As a result, the organic material is unevenly distributed in the crucible. Thus, a portion of the bottom is exposed during the evaporation, thereby affecting the uniformity of the evaporated organic material.

To this end, it is necessary to provide a new crucible for OLED evaporation source and a manufacturing method thereof which are capable of solving at least a part of the above problems.

SUMMARY

An objective of the present disclosure is to solve at least one aspect of the above problems and defects existed in the prior art.

According to an aspect of the present disclosure, it is provided a crucible for OLED evaporation source, comprising a body and an inner plate provided on the body, wherein a bottom of the body is gradually enlarged from down to up in a cross section perpendicular to a length direction of the body.

In an example, the bottom of the body is designed to have a V shape, a U shape or a combined shape thereof in the cross section perpendicular to the length direction of the body.

In an example, the bottom of the body is designed to have a single V shape, two connected V shapes or more connected V shapes in the cross section.

In an example, the bottom of the body is designed to have a single U shape, two connected U shapes or more connected U shapes in the cross section.

In an example, the bottom of the body is designed to have a combined shape of connected V shape and U shape in the cross section.

In an example, the inner plate is designed to have a shape matched with the shape of the bottom of the body in the cross section.

In an example, holes arranged in a predefined arrangement are provided in the inner plate so that material to be evaporated in the crucible is evaporated and deposited onto a substrate of OLED device disposed on or above the crucible, through the holes.

In an example, the projections of the holes in the inner plate onto a horizontal surface perpendicular to a height direction of the body are evenly distributed.

In an example, in a coordinate system which is established by setting a length direction of the body as X-axis, the width direction of the body as Y-axis and the height direction of the body as Z-axis, the projections of the holes in the inner plate onto the XY plane are evenly distributed.

In an example, among the projections onto the XY plane, there are multiple rows of holes which are spaced apart from each other by a first interval in the Y-axis direction, a plurality of holes in each of the rows extend in the X-axis direction and two adjacent holes of the plurality of holes in each of the rows are spaced apart from each other by a second interval.

In an example, the first interval is equal to the second interval.

In an example, two adjacent rows of holes are aligned with each other.

In an example, two adjacent rows of holes are not aligned with each other, and each of the holes in one of the rows is aligned with a midpoint of a connecting line between two adjacent holes in the other row.

In an example, the middle portion comprises at least two slant faces or at least one U-shape curved face in which the holes are formed.

In an example, the holes are not evenly distributed in the slant faces or curved face.

In an example, the inner plate comprises a middle portion in which the holes are formed.

In an example, the inner plate further comprises side portions at both sides of the middle portion, which cover on a top of the body.

According to another aspect of the present disclosure, it is provided a manufacturing method of a crucible for OLED evaporation source according to any one of the above aspect or examples, comprising:

providing a crucible having a body, a bottom of the body being gradually enlarged from down to up in a cross section perpendicular to a length direction of the body; and disposing an inner plate on an upper end of the body of the crucible.

In the embodiments of the present disclosure, by improving or optimizing the structure of the crucible (specifically, the structure of the bottom of the crucible), the evaporation uniformity and the material usage rate may be improved. Further, the influence on the uniformity of evaporated film layer due to too less remained material may be avoided. Thus, the performance of evaporated film layer is greatly improved.

BRIEF DESCRIPTION OF THE DRAWINGS

These and/or other aspects and advantages of the present disclosure will become apparent and more readily understood from the following description of the preferred embodiments with reference to accompanying drawings, wherein.

DETAILED DESCRIPTION OF PREFERRED EMBODIMENTS OF THE DISCLOSURE

Figure 1A:
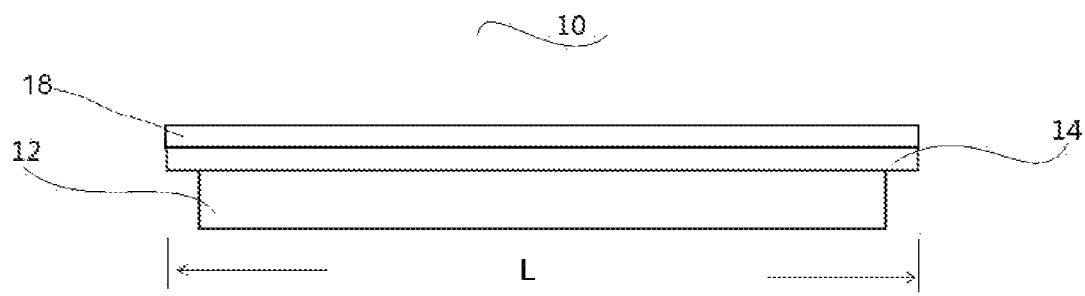
FIGS. 1a and 1b are a schematic cross section view of an existing crucible for OLED evaporation source in a direction perpendicular to a width direction thereof and a schematic cross section view of the existing crucible for OLED evaporation source in a direction perpendicular to a longitudinal or length direction thereof, respectively.

Technical solutions of the present disclosure will be further described in detail by means of the following embodiments in conjunction with the accompanying drawings 1-7. In the specification, the same or similar reference numerals refer to the same or like parts. The embodiments of the present disclosure with reference to the drawings are intended to explain the general inventive concept of the present disclosure, and should not be construed as a limitation of the present disclosure.

Figure 1B:
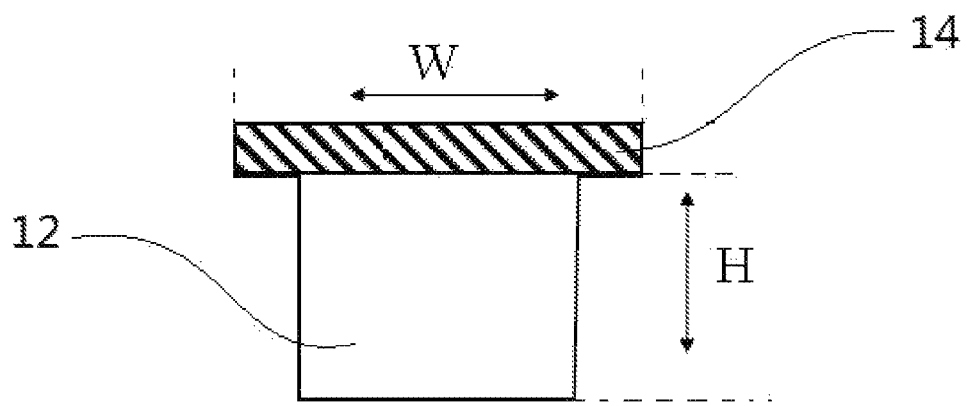

Referring to FIGS. 1a and 1b, a schematic cross section view of an existing crucible for OLED evaporation source in a direction perpendicular to a width direction thereof and a schematic cross section view of the existing crucible for OLED evaporation source in a direction perpendicular to a longitudinal or length direction thereof are respectively shown. Specifically, the crucible 10 comprises a body 12 and an inner plate 14 disposed on the body 12. As shown, a bottom of the body 12 is designed as a flat-bottom structure. The inner plate 14 is designed as a flat plate. Also, holes are provided in the inner plate so that material is evaporated and deposited onto a glass substrate 18 (i.e. a substrate for OLED device) disposed on or above the inner plate, through the holes.

If remained evaporated material is insufficient, then a portion of the bottom of the body 12 is exposed, that is, there is no evaporated material at some locations on the bottom or a portion of the bottom is not covered by the evaporated material. As a result, the material evaporated and deposited onto a glass substrate 18 above the inner plate 14 has a poor uniformity. Thus, in order to ensure an amount of the material evaporated and deposited onto the substrate, more material is filled sometimes. However, this leads to material waste.

FIG. 1a shows a length L of the inner plate 14, FIG. 1b shows a width W of the inner plate 14 and a height H of the body 12. Accordingly, a direction along the length L may be referred as a long-side direction, a length direction or a longitudinal direction, a direction along the width W may be referred to as a short-side direction or a width direction, and a direction along the height H may be referred to as a height direction.

A basic concept of the present disclosure is to set the bottom of the crucible as an arc-shaped structure with small curvature or a taper-shaped structure, so as to ensure maximally both a distribution uniformity in the long-side direction (length direction) and a distribution uniformity in the short-side direction (width direction) if there is less organic material. In this way, the new crucible according to embodiments of the present disclosure is applicable to the organic material which has a common fluidity after being liquefied. In comparison, the existing crucible is not applicable to such organic material which has a common fluidity after being liquefied.

With regard to OLED devices, an existing mass-produced mature technology is to prepare the devices by using a vacuum physical vapor deposition process. Specifically, a prepared back plate or substrate is placed into a vacuum chamber, then various organic material layers are evaporated and deposited onto the back plate or substrate by means of heat evaporation so as to form the OLED devices. The evaporation process is an important technical routine for producing OLED devices, and the crucible is a necessary component for the evaporation process. A structural design of the crucible has an important influence on a film quality and production efficiency of the organic material. Typically, the organic material is filled into the crucible, then the organic material in a gas form escapes into openings above the crucible when a temperature reaches an evaporation temperature of the material, thereafter, the organic material is deposited onto a surface of the back plate to form a compact evaporation film. Finally, a RGB (red, green and blue) device is formed by using patterns on a fine metal mask.

According to an aspect of the present disclosure, it is provided a crucible for OLED evaporation source, comprising a body and an inner plate provided on the body. A bottom of the body is gradually enlarged from down to up in a cross section perpendicular to a length direction of the body.

Figure 2A:
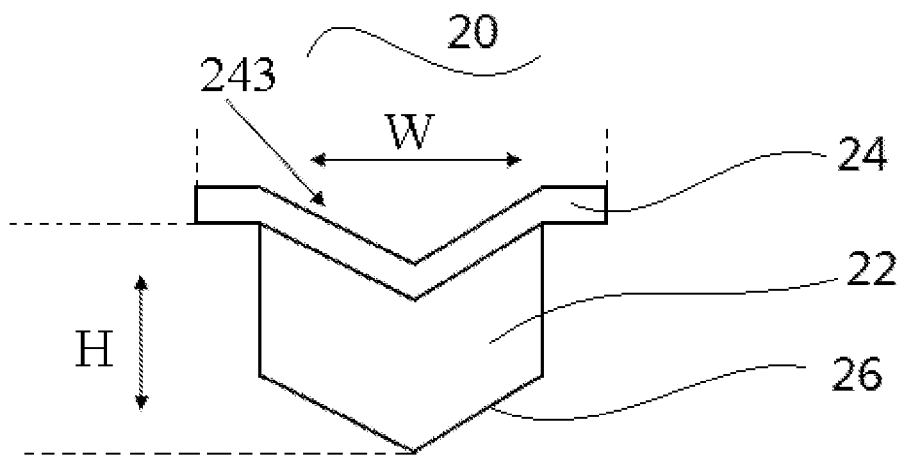
FIGS. 2a and 2b are a schematic cross section view of the crucible for OLED evaporation source according to an embodiment of the present disclosure in a direction perpendicular to a length direction thereof and a plan view of the inner plate of the crucible, respectively.
Figure 2B:
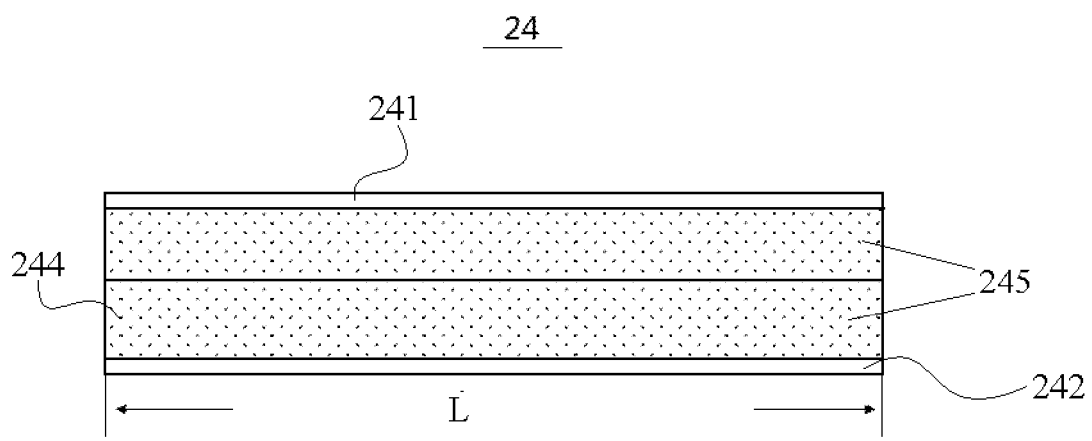

Referring to FIGS. 2a and 2b, a schematic cross section view of the crucible for OLED evaporation source according to an embodiment of the present disclosure in a direction perpendicular to a length direction thereof and a plan view of the inner plate of the crucible are respectively shown. The crucible 20 comprises a body 22 and an inner plate 24 provided on the body. As shown, a bottom 26 of the body 22 is designed as a V-shape structure. Accordingly, the inner plate 24 is also designed as a V-shape structure, and holes 244 (see FIG. 2b) arranged in a predefined arrangement are provided in the inner plate 24 so that material is evaporated and deposited onto a glass substrate (as indicated by the substrate 18 in FIG. 1a) disposed above the inner plate 24, through the holes 244.

It should be noted that the length direction (sometimes referred to as long-side direction) of the crucible is referred to as a direction in which the length of the crucible extends, accordingly, the width direction (sometimes referred to as short-side direction) of the crucible is referred to as a direction in which the width of the crucible extends. Such definitions are applicable to each of embodiments of the present disclosure, and they are not described in detail below.

As shown in FIG. 2a, the bottom 26 of the body 22 is designed as a single V shape in the cross section (i.e. the cross section as shown in FIG. 2a) perpendicular to the length direction. FIG. 2a shows a width W of the inner plate 24 and a height H of the body 22 of the crucible, and FIG. 2b shows a length L of the inner plate 24 (it can be seen combined with FIG. 1a that the length of the body 22 may be slightly shorter than the length of the inner plate 24). Obviously, specific values of the length L, width W and height H of the crucible may be selected by those skilled in the art as required. In an example, for example, the length L may be 880 mm, the width W may be 50 mm and the height H may be 120 mm.

As shown in FIGS. 2a and 2b, in a case that the length, width and height of the crucible are kept unchanged (that is, in the same case as shown in FIGS. 1a and 1b), the existing crucible is modified into having a bottom of V-shape structure so that the crucible is applicable to the organic material which has a low fluidity after being liquefied. It should be understood that, as the existing crucible is modified into having a bottom of V-shape structure with small curvature, both the distribution uniformity in the long-side direction and the distribution uniformity in the short-side direction may be ensured even if there is less organic material.

Further, as shown in FIG. 2b, the inner plate 24 comprises side portions 241, 242 at both sides and a middle portion 243 located between the two side portions. Specifically, the two side portions 241, 242 may cover on a top of sides of the body 22. Of course, other means may be selected by those skilled in the art as required in order to arrange the inner plate 24 on the body 22, instead of the above side portions.

The middle portion 243 comprises two slant faces 245 in which holes 244 (black points shown in FIG. 2) arranged in a predefined arrangement are provided. In an example, projections of the holes 244 in the middle portion 243 onto a horizontal surface perpendicular to the height direction H (that is, projections in the plan view shown in FIG. 2b or corresponding plan views) are evenly or equidistantly distributed. Specifically, in a coordinate system which is established by setting the length direction L as X-axis, the width direction W as Y-axis and the height direction H as Z-axis, the projections of the holes 244 in the middle portion 243 onto the XY plane are evenly or equidistantly distributed. In a specific example, among the projections onto the XY plane, there are multiple rows of holes which are spaced apart from each other by a first interval in the Y-axis direction, a plurality of holes in each of the rows extend in the X-axis direction and two adjacent holes of the plurality of holes in each of the rows are spaced apart from each other by a second interval. In a preferred example, the first interval is equal to the second interval. It should be understood that the projections of the holes onto the XY plane are evenly distributed if two adjacent rows of holes are aligned with each other. Of course, in a case that two adjacent rows of holes are not aligned with each other, each of the holes in one of the rows may be aligned with a midpoint of a connecting line between two adjacent holes in the other row, so that the projections of the holes onto the XY plane are evenly distributed, as shown in FIG. 2b, for example. As the projections of the holes onto the XY plane are evenly distributed, the evaporated material is evenly deposited onto the substrate of OLED device disposed on or above the crucible. It should be understood that, as the middle portion 243 of the inner plate is formed into the structure of V-shape groove in fact, the fact that the projections of the holes 244 onto the XY plane are evenly distributed means that the holes are not evenly distributed in the slant face 245 of the middle portion 243.

It should be noted that, in order to make the projections of the holes onto the XY plane be evenly distributed, those skilled in the art may design other hole arrangements, rather than the above specific arrangements. As such hole arrangements are obvious based on the above description of the present disclosure, they are not described in detail here.

Figure 3A:
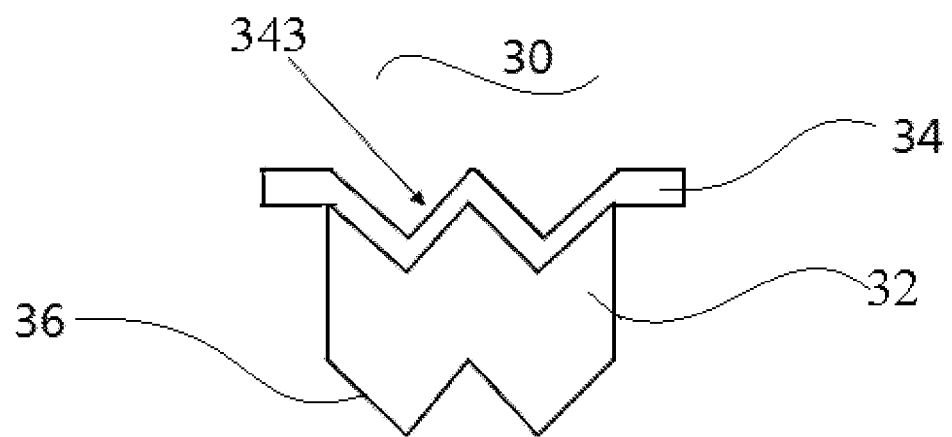
FIGS. 3a and 3b are a schematic cross section view of the crucible for OLED evaporation source according to another embodiment of the present disclosure in a direction perpendicular to a length direction thereof and a plan view of the inner plate of the crucible, respectively.
Figure 3B:
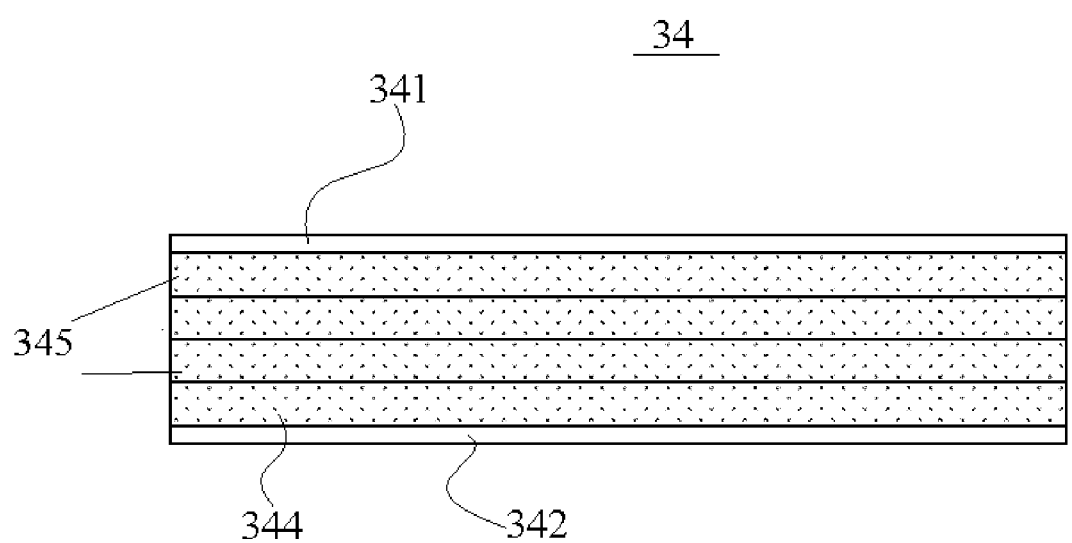

Referring to FIGS. 3a and 3b, a schematic cross section view of the crucible for OLED evaporation source according to another embodiment of the present disclosure in a direction perpendicular to a length direction thereof and a plan view of the inner plate of the crucible are respectively shown. The crucible 30 comprises a body 32 and an inner plate 34 provided on the body. As shown, a bottom 36 of the body 32 is designed as a W-shape structure. Accordingly, the inner plate 34 is also designed as a W-shape structure, and holes (see FIG. 3b) arranged in a predefined arrangement are provided in the inner plate 34 so that material is evaporated and deposited onto a glass substrate disposed above the inner plate 34, through the holes. As shown in FIG. 3a, the bottom 36 of the body 32 is designed as a single W shape in the cross section (i.e. the cross section as shown in FIG. 3a) perpendicular to the length direction. It should be understood that the W shape may be regarded as two connected V shapes.

Further, as shown in FIG. 3b, the inner plate 34 comprises side portions 341, 342 at both sides and a middle portion 343 located between the two side portions. Specifically, the two side portions 341, 342 may cover on a top of sides of the body 32.

The middle portion 343 comprises four slant faces 345 in which holes 344 arranged in a predefined arrangement are provided. In an example, projections of the holes 344 in the middle portion 343 onto a horizontal surface perpendicular to the height direction H (that is, projections in the plan view shown in FIG. 3b or corresponding plan views) are evenly or equidistantly distributed. Specifically, in a coordinate system which is established by setting the length direction L as X-axis, the width direction W as Y-axis and the height direction H as Z-axis, the projections of the holes 344 in the middle portion 343 onto the XY plane are evenly or equidistantly distributed. In a specific example, among the projections onto the XY plane, there are multiple rows of holes which are spaced apart from each other by a first interval in the Y-axis direction, and two adjacent holes in each of the rows are spaced apart from each other by a second interval. In a preferred example, the first interval is equal to the second interval. It should be understood that the projections of the holes onto the XY plane are evenly distributed if two adjacent rows of holes are aligned with each other. Of course, in a case that two adjacent rows of holes are not aligned with each other, each of the holes in one of the rows may be aligned with a midpoint of a connecting line between two adjacent holes in the other row, so that the projections of the holes onto the XY plane are evenly distributed, as shown in FIG. 3b, for example.

As shown in FIGS. 3a and 3b, in a case that the length, width and height of the crucible are kept unchanged, the existing crucible is modified into having a bottom of W-shape structure so that the crucible is applicable to the organic material which has a low fluidity after being liquefied. It should be understood that, as the existing crucible is modified into having a bottom of W-shape structure with small curvature, both the distribution uniformity in the long-side direction and the distribution uniformity in the short-side direction may be ensured even if there is less organic material.

Figure 4A:
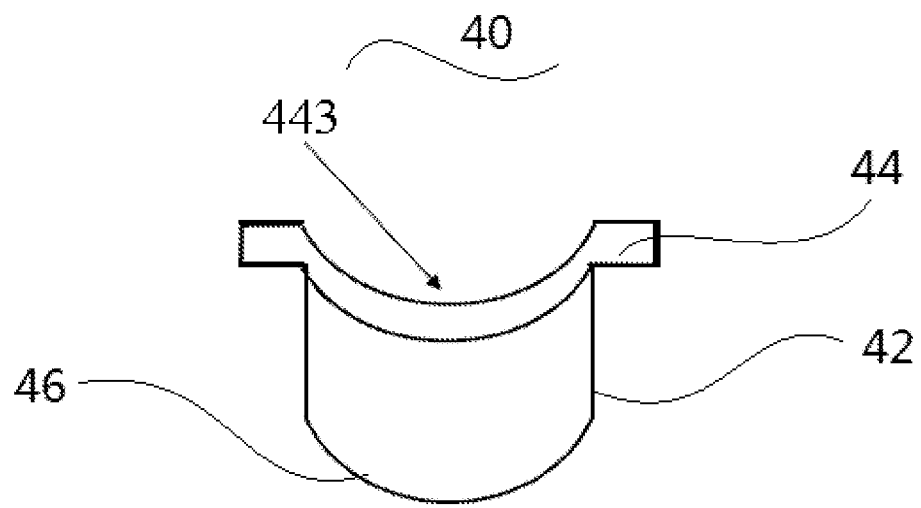
FIGS. 4a and 4b are a schematic cross section view of the crucible for OLED evaporation source according to a further embodiment of the present disclosure in a direction perpendicular to a length direction thereof and a plan view of the inner plate of the crucible, respectively.
Figure 4B:
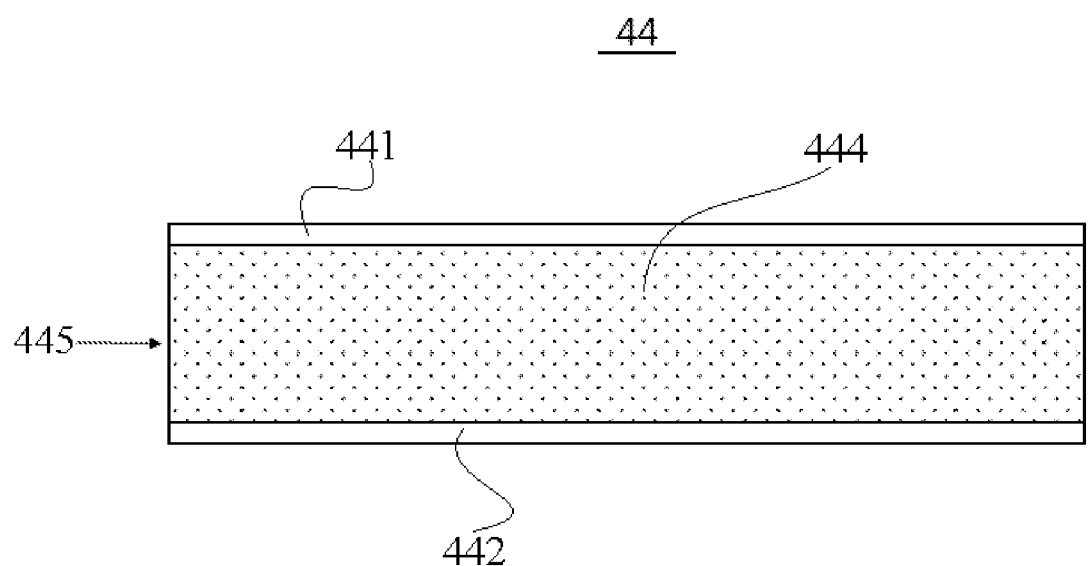

Referring to FIGS. 4a and 4b, a schematic cross section view of the crucible for OLED evaporation source according to a further embodiment of the present disclosure in a direction perpendicular to a length direction thereof and a plan view of the inner plate of the crucible are respectively shown. The crucible 40 comprises a body 42 and an inner plate 44 provided on the body 42. As shown, a bottom 46 of the body 42 is designed as a U-shape structure, that is, the bottom 46 is an arc-shape bottom. Accordingly, the inner plate 44 is also designed as a U-shape structure, and holes (see FIG. 4b) arranged in a predefined arrangement are provided in the inner plate 44 so that material is evaporated and deposited onto a glass substrate disposed above the inner plate 44, through the holes. As shown in FIG. 4a, the bottom 46 of the body 42 is designed as a single U shape in the cross section (i.e. the cross section as shown in FIG. 4a) perpendicular to the length direction.

Further, as shown in FIG. 4b, the inner plate 44 comprises side portions 441, 442 at both sides and a middle portion 443 located between the two side portions. Specifically, the two side portions 441, 442 may cover on a top of sides of the body 42.

The middle portion 443 comprises a U-shape curved face 445 in which holes 444 arranged in a predefined arrangement are provided. In an example, projections of the holes 444 in the middle portion 443 onto a horizontal surface perpendicular to the height direction H (that is, projections in the plan view shown in FIG. 4b or corresponding plan views) are evenly or equidistantly distributed. Specifically, in a coordinate system which is established by setting the length direction L as X-axis, the width direction W as Y-axis and the height direction H as Z-axis, the projections of the holes 444 in the middle portion 443 onto the XY plane are evenly or equidistantly distributed. In a specific example, among the projections onto the XY plane, there are multiple rows of holes which are spaced apart from each other by a first interval in the Y-axis direction, and two adjacent holes in each of the rows are spaced apart from each other by a second interval. In a preferred example, the first interval is equal to the second interval. It should be understood that the projections of the holes onto the XY plane are evenly distributed if two adjacent rows of holes are aligned with each other. Of course, in a case that two adjacent rows of holes are not aligned with each other, each of the holes in one of the rows may be aligned with a midpoint of a connecting line between two adjacent holes in the other row, so that the projections of the holes onto the XY plane are evenly distributed, as shown in FIG. 4b, for example.

As shown in FIGS. 4a and 4b, in a case that the length, width and height of the crucible are kept unchanged, the existing crucible is modified into having a bottom of U-shape structure so that the crucible is applicable to the organic material which has a low fluidity after being liquefied. It should be understood that, as the existing crucible is modified into having a bottom of arc-shape structure with small curvature, both the distribution uniformity in the long-side direction and the distribution uniformity in the short-side direction may be ensured even if there is less organic material.

Figure 5A:
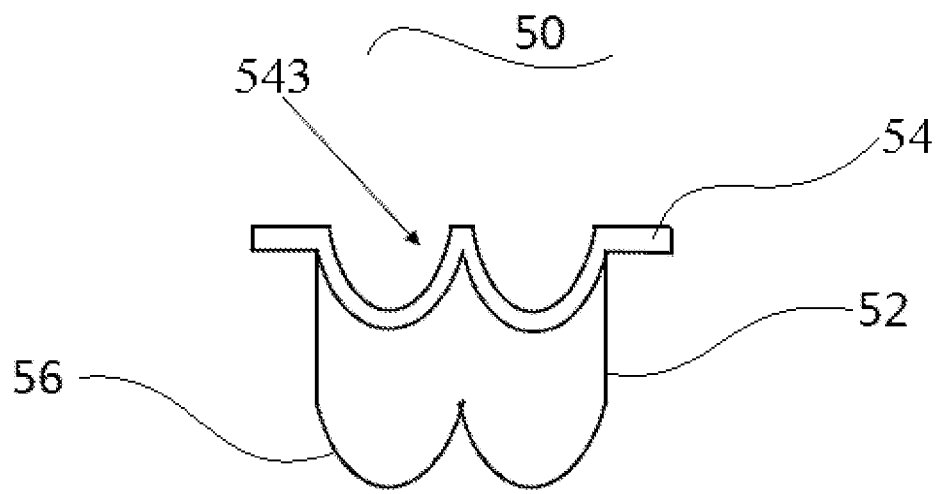
FIGS. 5a and 5b are a schematic cross section view of the crucible for OLED evaporation source according to a still further embodiment of the present disclosure in a direction perpendicular to a length direction thereof and a plan view of the inner plate of the crucible, respectively.
Figure 5B:
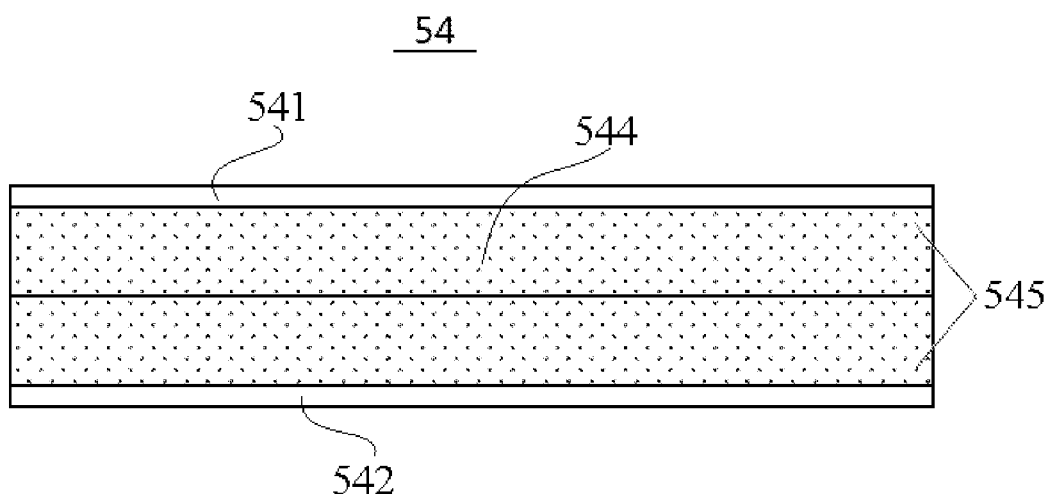

Referring to FIGS. 5a and 5b, a schematic cross section view of the crucible for OLED evaporation source according to a still further embodiment of the present disclosure in a direction perpendicular to a length direction thereof and a plan view of the inner plate of the crucible are respectively shown. The crucible 50 comprises a body 52 and an inner plate 54 provided on the body 52. As shown, a bottom 56 of the body 52 is designed as a structure of two connected U shapes. Accordingly, the inner plate 44 is also designed as a structure of two connected U shapes, and holes 544 (see FIG. 5b) arranged in a predefined arrangement are provided in the inner plate 54 so that material is evaporated and deposited onto a glass substrate disposed above the inner plate 54, through the holes. As shown in FIG. 5a, the bottom 56 of the body 52 is designed as the structure of two connected U shapes in the cross section (i.e. the cross section as shown in FIG. 5a) perpendicular to the length direction.

Further, as shown in FIG. 5b, the inner plate 54 comprises side portions 541, 542 at both sides and a middle portion 543 located between the two side portions. Specifically, the two side portions 541, 542 may cover on a top of sides of the body 52.

The middle portion 543 comprises two U-shape curved faces 545 in which holes 544 arranged in a predefined arrangement are provided. In an example, projections of the holes 544 in the middle portion 543 onto a horizontal surface perpendicular to the height direction H (that is, projections in the plan view shown in FIG. 5b or corresponding plan views) are evenly or equidistantly distributed. Specifically, in a coordinate system which is established by setting the length direction L as X-axis, the width direction W as Y-axis and the height direction H as Z-axis, the projections of the holes 544 in the middle portion 543 onto the XY plane are evenly or equidistantly distributed. In a specific example, among the projections onto the XY plane, there are multiple rows of holes which are spaced apart from each other by a first interval in the Y-axis direction, and two adjacent holes in each of the rows are spaced apart from each other by a second interval. In a preferred example, the first interval is equal to the second interval. It should be understood that the projections of the holes onto the XY plane are evenly distributed if two adjacent rows of holes are aligned with each other. Of course, in a case that two adjacent rows of holes are not aligned with each other, each of the holes in one of the rows may be aligned with a midpoint of a connecting line between two adjacent holes in the other row, so that the projections of the holes onto the XY plane are evenly distributed, as shown in FIG. 5b, for example.

As shown in FIGS. 5a and 5b, in a case that the length, width and height of the crucible are kept unchanged, the existing crucible is modified into having a bottom of the structure of two connected U shapes so that the crucible is applicable to the organic material which has a low fluidity after being liquefied. It should be understood that, as the existing crucible is modified into having a bottom of arc-shape structure with small curvature, both the distribution uniformity in the long-side direction and the distribution uniformity in the short-side direction may be ensured even if there is less organic material.

Figure 6:
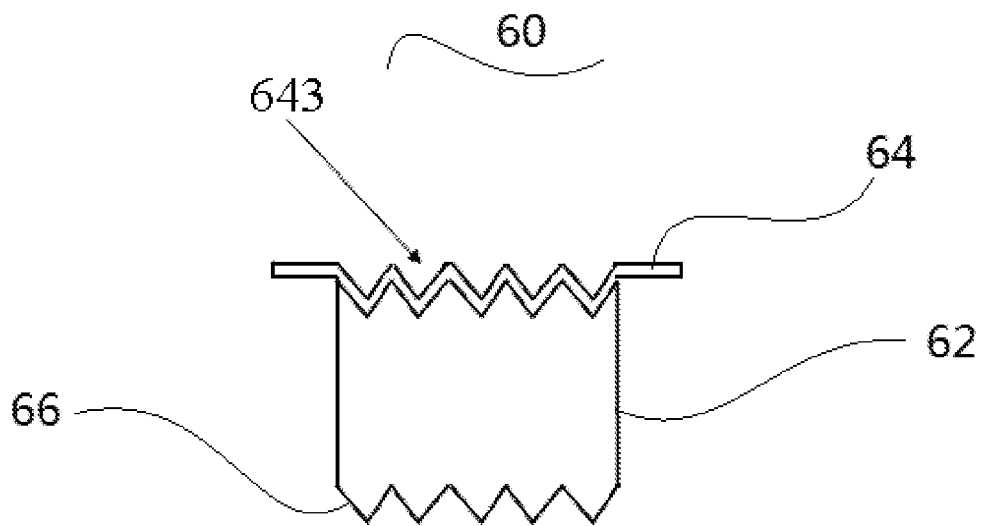
FIG. 6 is a schematic cross section view of the crucible for OLED evaporation source according to another further embodiment of the present disclosure in a direction perpendicular to a length direction thereof.

Referring to FIG. 6, a schematic cross section view of the crucible for OLED evaporation source according to another further embodiment of the present disclosure in a direction perpendicular to a length direction thereof is shown. The crucible 60 comprises a body 62 and an inner plate 64 provided on the body 62. As shown, a bottom 66 of the body 62 is designed as a structure of multiple connected V shapes. Accordingly, the inner plate 64 is also designed as a structure of multiple connected V shapes, and holes arranged in a predefined arrangement are provided in the inner plate 64 so that material is evaporated and deposited onto a glass substrate disposed above the inner plate 64, through the holes. As shown in FIG. 6, the bottom 66 of the body 62 is designed as the structure of multiple connected V shapes in the cross section (i.e. the cross section as shown in FIG. 6) perpendicular to the length direction.

The structures in the embodiment shown in FIG. 6 is substantially same as that in the embodiment illustrated in FIG. 3a, except that the middle portion 643 of the inner plate 64 is designed as the structure of multiple V shapes in the cross section perpendicular to the length direction. Thus, the specific arrangements with regard to the inner plate and the hole distribution are not described in detail here. As shown in FIG. 6, as the crucible is designed to have a bottom of the structure of multiple connected V shapes, both the distribution uniformity in the long-side direction and the distribution uniformity in the short-side direction may be ensured even if there is less organic material.

Figure 7:
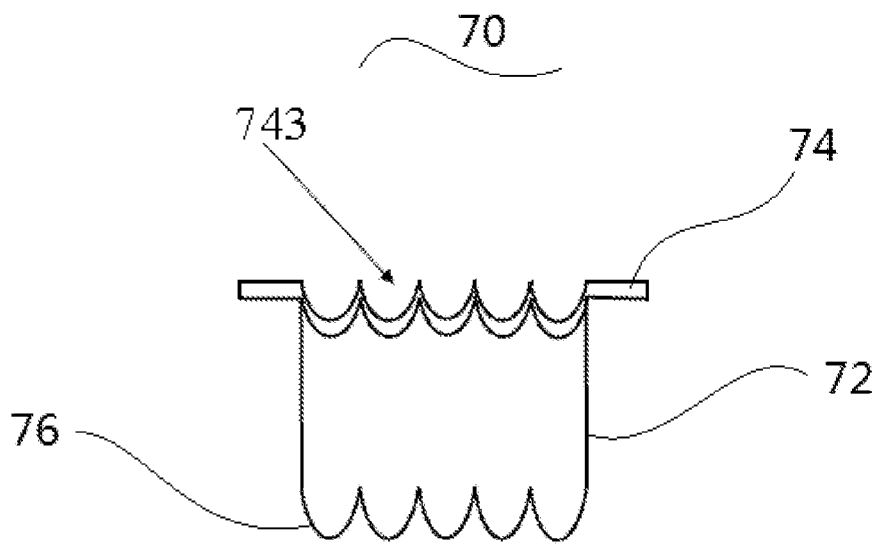
FIG. 7 is a schematic cross section view of the crucible for OLED evaporation source according to a still another further of the present disclosure in a direction perpendicular to a length direction thereof.

Referring to FIG. 7, a schematic cross section view of the crucible for OLED evaporation source according to a still another further embodiment of the present disclosure in a direction perpendicular to a length direction thereof is shown. The crucible 70 comprises a body 72 and an inner plate 74 provided on the body 72. As shown, a bottom 76 of the body 72 is designed as a structure of multiple connected U shapes. Accordingly, the inner plate 74 is also designed as a structure of multiple connected U shapes, and holes arranged in a predefined arrangement are provided in the inner plate 74 so that material is evaporated and deposited onto a glass substrate disposed above the inner plate 74, through the holes. The bottom 76 of the body 72 is designed as the structure of multiple connected U shapes in the cross section (i.e. the cross section as shown in FIG. 7) perpendicular to the length direction.

The structures in the embodiment shown in FIG. 7 is substantially same as that in the embodiment illustrated in FIG. 5a, except that the middle portion 743 of the inner plate 74 is designed as the structure of multiple U shapes in the cross section perpendicular to the length direction. Thus, the specific arrangements with regard to the inner plate and the hole distribution are not described in detail here.

As shown in FIG. 7, as the crucible is designed to have a bottom of the structure of multiple connected U shapes, that is, the existing crucible is modified into having a bottom of arc-shape structure with small curvature, both the distribution uniformity in the long-side direction and the distribution uniformity in the short-side direction may be ensured even if there is less organic material.

Though it is not described herein that the bottom of the crucible may have a structure of combined V shape and U shape, it should be understood that the bottom having such structure may be obtained by those skilled in the art based on the above structures illustrated in the above various embodiments. Those skilled in the art may also set specific combined manners of V shape and U shape as required, which are not further described in detail here. It can be understood from the above examples that the technical problems may be solved as long as the bottom of the body of the crucible is designed to enlarge gradually from down to up in the cross section perpendicular to the length direction of the body. Therefore, the specific shapes of the bottom of the body of the crucible may be selected as required, rather than limiting to the shapes illustrated in the above examples.

Accordingly, another aspect of the present disclosure further provides a manufacturing method of the above crucible for OLED evaporation source, comprising:

providing a crucible having a body, a bottom of the body of the crucible being designed to enlarge gradually from down to up in the cross section perpendicular to the length direction of the body; and disposing an inner plate on an upper end of the body of the crucible.

Specific arrangements of the inner plate and the body may refer to the above description, which are not described in detail here.

Various embodiments of the present disclosure provide a crucible for OLED evaporation source, which has a bottom of taper-shape groove structure or arc-shape structure so as to avoid the influence on the uniformity of evaporated material caused by a reduction of amount of the remained material due to an evaporation of a great quantity of material and to improve the uniformity of evaporated material and usage rate of material effectively.

The conventional crucible has a flat-bottom structure. In addition, the organic material itself has a high viscosity and a surface tension effect is presented after the organic material is liquefied. As a result, the organic material is unevenly distributed in the crucible. Thus, a portion of the bottom is exposed during the evaporation, thereby affecting the uniformity of the evaporated organic material. In the various embodiments of the present disclosure, by optimizing the structure of the bottom of the crucible, the bottom of the body is designed to have a V shape, U shape or combined shape thereof, so as to improve the distribution uniformity of the liquefied organic material, thereby improving the evaporation uniformity and the usage rate of the material.

The above descriptions are only some embodiments of the present disclosure, those skilled in the art will appreciate that changes may be made to these embodiments without departing from the principle and spirit of the general inventive concept of the present disclosure, and the scope of the present disclosure are defined by the appended claims and their equivalents.

What is claimed is:

1. A crucible for OLED evaporation source, comprising a body and an inner plate provided on the body, wherein a bottom of the body is gradually enlarged from down to up in a cross section perpendicular to a length direction of the body,
   wherein the inner plate is designed to have a shape matched with the shape of the bottom of the body in the cross section,
   wherein holes arranged in a predefined arrangement are provided in the inner plate so that material to be evaporated in the crucible is evaporated and deposited onto a substrate of OLED device disposed on or above the crucible, through the holes,
   wherein in a coordinate system which is established by setting a length direction of the body as X-axis, a width direction of the body as Y-axis and a height direction of the body as Z-axis, the projections of the holes in the inner plate onto XY plane are evenly distributed, and
   wherein among the projections onto the XY plane, there are multiple rows of holes which are spaced apart from each other by a first interval in the Y-axis direction, a plurality of holes in each of the rows extend in the X-axis direction and two adjacent holes of the plurality of holes in each of the rows are spaced apart from each other by a second interval, the first interval being equal to the second interval.

2. The crucible for OLED evaporation source according to claim 1, wherein the bottom of the body is designed to have a V shape, a U shape or a combined shape thereof in the cross section perpendicular to the length direction of the body.

3. The crucible for OLED evaporation source according to claim 2, wherein,
the bottom of the body is designed to have a single V shape, two connected V shapes or more connected V shapes in the cross section.

4. The crucible for OLED evaporation source according to claim 2, wherein,
the bottom of the body is designed to have a single U shape, two connected U shapes or more connected U shapes in the cross section.

5. The crucible for OLED evaporation source according to claim 2, wherein,
the bottom of the body is designed to have a combined shape of connected V shape and U shape in the cross section.

6. The crucible for OLED evaporation source according to claim 1, wherein two adjacent rows of holes are aligned with each other.

7. The crucible for OLED evaporation source according to claim 1, wherein,
two adjacent rows of holes are not aligned with each other, and each of the holes in a first one of the rows is aligned with a midpoint of a connecting line between two adjacent holes in a second one of the rows.

8. The crucible for OLED evaporation source according to claim 1, wherein the inner plate comprises a middle portion in which the holes are formed.

9. The crucible for OLED evaporation source according to claim 8, wherein,
the inner plate further comprises side portions at both sides of the middle portion, which cover on a top of the body.

10. The crucible for OLED evaporation source according to claim 8, wherein,
the middle portion comprises at least two slanted faces or at least one U-shape curved face in which the holes are formed.

11. The crucible for OLED evaporation source according to claim 10, wherein,
the holes are not evenly distributed in the slanted faces or curved face.

12. A manufacturing method of a crucible for OLED evaporation source, comprising:
providing the body of the crucible according to claim 1; and
disposing the inner plate on an upper end of the body of the crucible.

* * * * *